United States Patent
Yamaguchi et al.

(10) Patent No.: US 12,294,393 B2
(45) Date of Patent: *May 6, 2025

(54) RADIO FREQUENCY MODULE AND COMMUNICATION APPARATUS

(71) Applicant: Murata Manufacturing Co., Ltd., Nagaokakyo (JP)

(72) Inventors: Yukiya Yamaguchi, Nagaokakyo (JP); Teruaki Oshita, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 571 days.

This patent is subject to a terminal disclaimer.

(21) Appl. No.: 17/679,127

(22) Filed: Feb. 24, 2022

(65) Prior Publication Data

US 2022/0393706 A1 Dec. 8, 2022

Related U.S. Application Data

(63) Continuation of application No. PCT/JP2020/024593, filed on Jun. 23, 2020.

(30) Foreign Application Priority Data

Aug. 30, 2019 (JP) .................................. 2019-158594

(51) Int. Cl.
*H04B 1/04* (2006.01)

(52) U.S. Cl.
CPC .......... *H04B 1/04* (2013.01); *H04B 2001/045* (2013.01)

(58) Field of Classification Search
CPC ...... H04B 1/04; H04B 2001/045; H04B 1/00; H04B 1/38; H04B 1/006; H04B 1/0057;
(Continued)

(56) References Cited

U.S. PATENT DOCUMENTS 6,233,434 B1 * 5/2001 Takei ........................ H04B 1/00
455/562.1
9,178,555 B2 * 11/2015 Ichitsubo .................. H04B 1/38
(Continued)

FOREIGN PATENT DOCUMENTS

WO 00/028673 A1 5/2000
WO 2014/171033 A1 10/2014
(Continued)

OTHER PUBLICATIONS

International Search Report and Written Opinion mailed on Sep. 29, 2020, received for PCT Application PCT/JP2020/024593, Filed on Jun. 23, 2020, 9 pages including English Translation.

*Primary Examiner* — Lana N Le
(74) *Attorney, Agent, or Firm* — XSENSUS LLP

(57) ABSTRACT

A radio frequency module includes a module substrate, a power amplifier that amplifies a transmission signal in a middle band group, a low noise amplifier that amplifies a reception signal in the middle band group, and a conductive component that transmits a radio frequency signal in a high band group, wherein the power amplifier is mounted on a main surface of the module substrate, the low noise amplifier is mounted on a main surface of the module substrate, and the conductive component is mounted between the power amplifier and the low noise amplifier on the main surface when the module substrate is viewed in plan.

19 Claims, 6 Drawing Sheets

(58) Field of Classification Search
CPC .... H04B 2001/0408; H04B 1/44; H04B 1/40; H04B 1/48; H04B 1/406; H04B 1/18; H04B 1/0483; H04B 1/0053; H04B 1/16; H04B 1/54; H01L 25/04; H01L 25/18; H01L 25/16; H01L 23/49827; H01L 23/66; H01L 2223/6655; H01L 25/50; H01L 23/5383; H01L 23/5384; H03H 9/0552; H05K 1/0237; H05K 2201/10098; H05K 2201/10166

See application file for complete search history.

(56) References Cited

U.S. PATENT DOCUMENTS

| | | | | |
|---|---|---|---|---|
| 11,431,361 | B2* | 8/2022 | Kitajima | H04B 1/405 |
| 12,136,614 | B2* | 11/2024 | Yamaguchi | H01L 25/18 |
| 2010/0311474 | A1* | 12/2010 | Donovan | H04B 1/04 |
| | | | | 455/574 |
| 2016/0006415 | A1* | 1/2016 | Takematsu | H04B 15/06 |
| 2017/0026104 | A1* | 1/2017 | Lange | H04B 1/04 |
| 2018/0167094 | A1* | 6/2018 | Aramata | H04B 1/52 |
| 2023/0238994 | A1* | 7/2023 | Lin | H04B 1/00 |
| | | | | 455/552.1 |

FOREIGN PATENT DOCUMENTS

| | | |
|---|---|---|
| WO | 2014/175133 A1 | 10/2014 |
| WO | 2018/168500 A1 | 9/2018 |

* cited by examiner

RADIO FREQUENCY MODULE AND COMMUNICATION APPARATUS

CROSS-REFERENCE TO RELATED APPLICATIONS

This application claims priority to PCT/JP2020/024593, filed Jun. 23, 2020, which claims priority to JP 2019-158594, filed Aug. 30, 2019, the contents of both of which are incorporated by reference in their entirety.

TECHNICAL FIELD

The present disclosure relates to a radio frequency module and a communication apparatus.

BACKGROUND

In mobile communication apparatuses such as cellular phones, modularization and miniaturization of radio frequency front-end circuits compatible with equal to or more than two band groups among a low band group, a middle band group, and a high band group, which are frequency bands corresponding to a fourth generation mobile communication system (4G) and a fifth generation mobile communication system (5G), are required with development of multi-banding.

Conventionally, a semiconductor module may have a configuration in which a filter is mounted on an upper surface of a double-sided mountable wiring substrate and a transmission power amplifier and a reception low noise amplifier are mounted on a lower surface of the wiring substrate.

SUMMARY

A radio frequency module according to an aspect of the disclosure includes a mounting substrate having a first main surface and a second main surface that face each other; a first transmission power amplifier mounted on the first main surface, the first transmission power amplifier amplifying a transmission signal in a first band group; a first reception low noise amplifier mounted on the second main surface, the first reception low noise amplifier amplifying a reception signal in the first band group; and a conductor arranged on a transmission path for transmitting a radio frequency signal in a second band group, the second band group having frequencies which do not overlap with frequencies of the first band group. The conductor is mounted on the first main surface or the second main surface. In a plan view, the conductor is between the first transmission power amplifier and the first reception low noise amplifier.

DETAILED DESCRIPTION OF THE DRAWINGS

Figure 1:
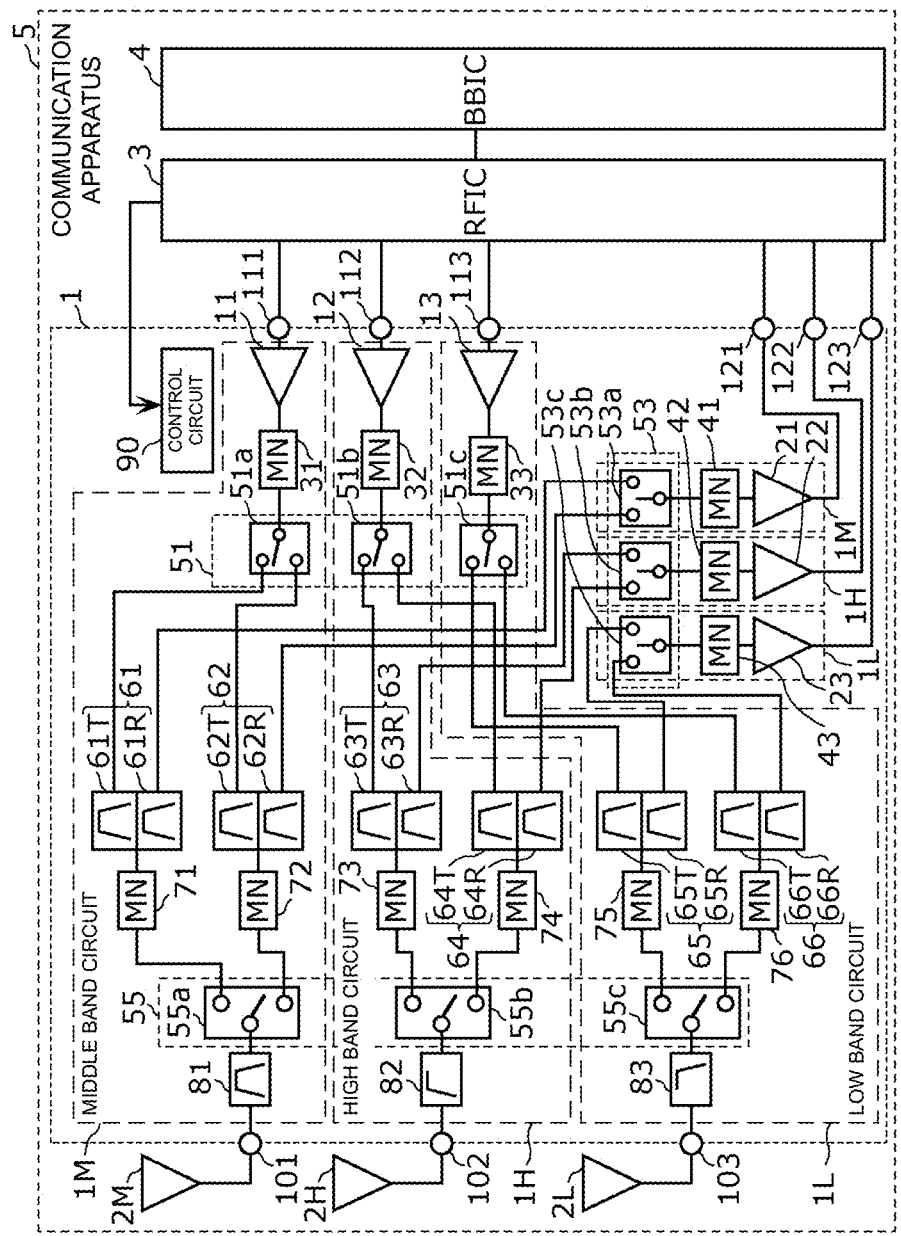
FIG. 1 is a circuit configuration diagram of a radio frequency module and a communication apparatus according to an embodiment.

The inventors of the present disclosure have recognized that a conventional semiconductor module has limitations. Since the transmission power amplifier and the reception low noise amplifier are mounted and arranged on the same surface (lower surface) of the wiring substrate, the area of the lower surface is increased, and the semiconductor module cannot be miniaturized. Further, in the case where the transmission power amplifier and the reception low noise amplifier mounted on the same surface (lower surface) amplify radio frequency signals in the same band group, there is a problem that a transmission signal and a reception signal in the corresponding band group interfere with each other and isolation between transmission and reception is deteriorated.

The inventors have developed technology as detailed in this disclosure so as to solve these issues, to provide a small-sized radio frequency module and a small-sized communication apparatus with improved isolation between transmission and reception of radio frequency signals in the same band group.

Hereinafter, an embodiment of the disclosure will be described in detail with reference to an example and a variation. It should be noted that all of the example and the variation described below represent comprehensive or specific examples. Numerical values, shapes, materials, constituent elements, arrangements and connection forms of the constituent elements, and the like described in the following example and variation are examples and are not intended to limit the present disclosure. Among the constituent elements in the following example and variation, constituent elements not recited in independent claims are described as arbitrary constituent elements. In addition, the sizes or size ratios of the constituent elements illustrated in the drawings are not necessarily strict.

In the following embodiment, as for A, B, and C mounted on a substrate, an expression "C is arranged between A and B when the substrate (or the main surface of the substrate) is viewed in plan" is defined to indicate that at least a part of a region of C projected when the substrate is viewed in plan overlaps with a line connecting an arbitrary point in a region of A projected when the substrate is viewed in plan(when the substrate is viewed from the normal direction of the substrate) and an arbitrary point in a region of B projected when the substrate is viewed in plan.

Embodiment

[1. Circuit Configuration of Radio Frequency Module 1 and Communication Apparatus 5]

FIG. 1 is a circuit configuration diagram of a radio frequency module 1 and a communication apparatus 5 according to a first embodiment. As illustrated in the drawing, the communication apparatus 5 includes the radio frequency module 1, antennas 2H, 2L, and 2M, an RF signal processing circuit (RFIC) 3, and a baseband signal processing circuit (BBIC) 4.

The RFIC 3 is an RF signal processing circuit configured to process radio frequency signals that are transmitted and received by the antennas 2H, 2L, and 2M. To be specific, the RFIC 3 processes radio frequency reception signals input while passing through a reception signal path of the radio frequency module 1 by down-conversion or the like and outputs reception signals generated by the signal processing to the BBIC 4. Further, the RFIC 3 processes transmission signals input from the BBIC 4 by up-conversion or the like and outputs radio frequency transmission signals generated by the signal processing to a transmission signal path of the radio frequency module 1.

The BBIC 4 is a circuit configured to perform signal processing using an intermediate frequency band lower than radio frequency signals propagating through the radio frequency module 1. A signal processed by the BBIC 4 is used, for example, as an image signal for image display or as an audio signal for a telephone call with a loudspeaker.

The RFIC 3 also has a function as a controller that controls connection of switch circuits 51, 53, and 55 included in the radio frequency module 1 based on a communication band to be used. Specifically, the controller transmits a control signal for switching the connection of the switch circuits 51, 53, and 55 included in the radio frequency module 1 to a control circuit 90 of the radio frequency module 1. Further, the controller transmits a control signal for adjusting gains and the like of power amplifiers 11, 12, and 13 and low noise amplifiers 21, 22, and 23 of the radio frequency module 1 to the control circuit 90. In response to these control signals, the control circuit 90 outputs control signals to the switch circuits 51, 53 and 55, the power amplifiers 11, 12 and 13, and the low noise amplifiers 21, 22 and 23. The control circuit 90 may be a circuit that controls at least one of the switch circuits 51, 53, and 55, the power amplifiers 11, 12, and 13, and the low noise amplifiers 21, 22, and 23. Further, the controller may be provided outside the RFIC 3, for example, may be provided in the BBIC 4.

The antenna 2M is connected to an antenna connection terminal 101 of the radio frequency module 1, radiates transmission signals output from a middle band circuit 1M of the radio frequency module 1, and receives reception signals from the outside and outputs the reception signals to the middle band circuit 1M.

The antenna 2H is connected to an antenna connection terminal 102 of the radio frequency module 1, radiates transmission signals output from a high band circuit 1H of the radio frequency module 1, and receives reception signals from the outside and outputs the reception signals to the high band circuit 1H.

The antenna 2L is connected to an antenna connection terminal 103 of the radio frequency module 1, radiates transmission signals output from a low band circuit 1L of the radio frequency module 1, and receives reception signals from the outside and outputs the reception signals to the low band circuit 1L.

Next, a detailed configuration of the radio frequency module 1 will be described.

As illustrated in FIG. 1, the radio frequency module 1 includes the antenna connection terminals 101, 102, and 103, the middle band circuit 1M, the high band circuit 1H, the low band circuit 1L, the control circuit 90, transmission input terminals 111, 112, and 113, and reception output terminals 121, 122, and 123.

The antenna connection terminal 101 is connected to the antenna 2M, the antenna connection terminal 102 is connected to the antenna 2H, and the antenna connection terminal 103 is connected to the antenna 2L.

The low band circuit 1L is a circuit that transmits transmission signals and reception signals in communication bands belonging to a low band group. The middle band circuit 1M is a circuit that transmits transmission signals and reception signals in communication bands belonging to a middle band group. The high band circuit 1H is a circuit that transmits transmission signals and reception signals in communication bands belonging to a high band group.

The low band group is a frequency band group formed by a plurality of communication bands corresponding to 4G and 5G and has a frequency range of equal to or lower than 1 GHz, for example. The low band group includes communication bands such as Band 5 (transmission band: 824 to 849 MHz, reception band: 869 to 894 MHz), Band 8 (transmission band: 880 to 915 MHz, reception band: 925 to 960 MHz), and Band 28 (transmission band: 703 to 748 MHz, reception band: 753 to 803 MHz) of long term evolution (LTE), for example.

The middle band group is a frequency band group formed by a plurality of communication bands corresponding to 4G and 5G, is on the higher frequency side than the low band group, and has a frequency range of 1.5 to 2.2 GHz, for example. The middle band group includes communication bands such as Band 1 (transmission band: 1920 to 1980 MHz, reception band: 2110 to 2170 MHz), Band 39 (transmission/reception band: 1880 to 1920 MHz), and Band 66 (transmission band: 1710 to 1780 MHz, reception band: 2110 to 2200 MHz) of LTE, for example.

The high band group is a frequency band group formed by a plurality of communication bands corresponding to 4G and 5G, is on the higher frequency side than the middle band group, and has a frequency range of 2.4 to 2.8 GHz, for example. The high band group includes communication bands such as Band 7 (transmission band: 2500 to 2570 MHz, reception band: 2620 to 2690 MHz) and Band 41 (transmission/reception band: 2496 to 2690 MHz), for example.

The middle band circuit 1M includes the power amplifier 11, the low noise amplifier 21, a band pass filter 81, duplexers 61 and 62, matching circuits 31, 41, 71 and 72, and switches 51*a*, 53*a* and 55*a*.

The power amplifier 11 is a transmission power amplifier that amplifies the transmission signals in the communication bands belonging to the middle band group. The low noise amplifier 21 is a reception low noise amplifier that amplifies the reception signals in the communication bands belonging to the middle band group with low noise.

The band pass filter 81 is connected between the antenna connection terminal 101 and the switch 55*a*, uses the frequency range of the middle band group as a pass band, and transmits both the transmission signals and the reception signals in the middle band group.

The duplexer 61 transmits radio frequency signals in a communication band A of the middle band group and includes a transmission filter 61T and a reception filter 61R. The transmission filter 61T is arranged on a transmission path connecting the power amplifier 11 and the antenna connection terminal 101 and transmits transmission signals in a transmission band of the communication band A among the transmission signals amplified by the power amplifier 11. The reception filter 61R is arranged on a reception path connecting the low noise amplifier 21 and the antenna connection terminal 101 and transmits reception signals in a reception band of the communication band A among the reception signals input from the antenna connection terminal 101.

The duplexer 62 transmits radio frequency signals in a communication band B of the middle band group and includes a transmission filter 62T and a reception filter 62R. The transmission filter 62T is arranged on a transmission path connecting the power amplifier 11 and the antenna connection terminal 101 and transmits transmission signals in a transmission band of the communication band B among the transmission signals amplified by the power amplifier 11. The reception filter 62R is arranged on a reception path connecting the low noise amplifier 21 and the antenna connection terminal 101 and transmits reception signals in a reception band of the communication band B among the reception signals input from the antenna connection terminal 101.

The matching circuit 31 is arranged on a transmission path connecting the power amplifier 11 and the transmission filters 61T and 62T and performs impedance matching between the power amplifier 11 and the switch 51a and the transmission filters 61T and 62T. The matching circuit 41 is arranged on a reception path connecting the low noise amplifier 21 and the reception filters 61R and 62R and performs impedance matching between the low noise amplifier 21 and the switch 53a and the reception filters 61R and 62R. The matching circuit 71 is arranged on a path connecting the switch 55a and the duplexer 61 and performs impedance matching between the band pass filter 81 and the switch 55a and the duplexer 61. The matching circuit 72 is arranged on a path connecting the switch 55a and the duplexer 62 and performs impedance matching between the band pass filter 81 and the switch 55a and the duplexer 62.

The switch 51a is arranged on a transmission path connecting the matching circuit 31 and the transmission filters 61T and 62T and switches connection between the power amplifier 11 and the transmission filter 61T and connection between the power amplifier 11 and the transmission filter 62T. The switch 51a is configured by, for example, a single pole double throw (SPDT)-type switch circuit in which a common terminal is connected to the matching circuit 31, one selection terminal is connected to the transmission filter 61T, and the other selection terminal is connected to the transmission filter 62T.

The switch 53a is arranged on a reception path connecting the matching circuit 41 and the reception filters 61R and 62R and switches connection between the low noise amplifier 21 and the reception filter 61R and connection between the low noise amplifier 21 and the reception filter 62R. The switch 53a is configured by, for example, an SPDT switch circuit in which a common terminal is connected to the matching circuit 41, one selection terminal is connected to the reception filter 61R, and the other selection terminal is connected to the reception filter 62R.

The switch 55a switches connection between the band pass filter 81 and the matching circuit 71 and connection between the band pass filter 81 and the matching circuit 72. The switch 55a is configured by, for example, an SPDT switch circuit in which a common terminal is connected to the band pass filter 81, one selection terminal is connected to the matching circuit 71, and the other selection terminal is connected to the matching circuit 72. In addition, the switch 55a can prevent the radio frequency signals in the middle band group from being transmitted through the middle band circuit 1M by connecting the common terminal to none of the selection terminals. That is, the switch 55a is an antenna switch that switches connection and disconnection between the middle band circuit 1M and the antenna 2M.

In the middle band circuit 1M, the number of communication bands to be transmitted is not limited to two and may be one or equal to or more than three. The necessity of the band pass filter 81, the number of duplexers, the number of matching circuits, and the necessities of the respective switches are determined in accordance with the number of communication bands.

The high band circuit 1H includes the power amplifier 12, the low noise amplifier 22, a high pass filter 82, duplexers 63 and 64, matching circuits 32, 42, 73 and 74, and switches 51b, 53b and 55b.

The power amplifier 12 is a transmission power amplifier that amplifies the transmission signals in the communication bands belonging to the high band group. The low noise amplifier 22 is a reception low noise amplifier that amplifies the reception signals in the communication bands belonging to the high band group with low noise.

The high pass filter 82 is connected between the antenna connection terminal 102 and the switch 55b, uses the frequency range of the high band group as a pass band, and transmits both the transmission signals and the reception signals in the high band group. Note that the high pass filter 82 may be a band pass filter whose pass band is the frequency range of the high band group.

The duplexer 63 transmits radio frequency signals in a communication band C of the high band group and includes a transmission filter 63T and a reception filter 63R. The transmission filter 63T is arranged on a transmission path connecting the power amplifier 12 and the antenna connection terminal 102 and transmits transmission signals in a transmission band of the communication band C among the transmission signals amplified by the power amplifier 12. The reception filter 63R is arranged on a reception path connecting the low noise amplifier 22 and the antenna connection terminal 102 and transmits reception signals in a reception band of the communication band C among the reception signals input from the antenna connection terminal 102.

The duplexer 64 transmits radio frequency signals in a communication band D of the high band group and includes a transmission filter 64T and a reception filter 64R. The transmission filter 64T is arranged on a transmission path connecting the power amplifier 12 and the antenna connection terminal 102 and transmits transmission signals in a transmission band of the communication band D among the transmission signals amplified by the power amplifier 12. The reception filter 64R is arranged on a reception path connecting the low noise amplifier 22 and the antenna connection terminal 102 and transmits reception signals in a reception band of the communication band D among the reception signals input from the antenna connection terminal 102.

The matching circuit 32 is arranged on a transmission path connecting the power amplifier 12 and the transmission filters 63T and 64T and performs impedance matching between the power amplifier 12 and the switch 51b and the transmission filters 63T and 64T. The matching circuit 42 is arranged on a reception path connecting the low noise amplifier 22 and the reception filters 63R and 64R and performs impedance matching between the low noise amplifier 22 and the switch 53b and the reception filters 63R and 64R. The matching circuit 73 is arranged on a path connecting the switch 55b and the duplexer 63 and performs impedance matching between the high pass filter 82 and the switch 55b and the duplexer 63. The matching circuit 74 is arranged on a path connecting the switch 55b and the duplexer 64 and performs impedance matching between the high pass filter 82 and the switch 55b and the duplexer 64.

The switch 51b is arranged on a transmission path connecting the matching circuit 32 and the transmission filters 63T and 64T and switches connection between the power amplifier 12 and the transmission filter 63T and connection between the power amplifier 12 and the transmission filter 64T. The switch 51b is configured by, for example, an SPDT switch circuit in which a common terminal is connected to the matching circuit 32, one selection terminal is connected to the transmission filter 63T, and the other selection terminal is connected to the transmission filter 64T.

The switch 53b is arranged on a reception path connecting the matching circuit 42 and the reception filters 63R and 64R and switches connection between the low noise amplifier 22 and the reception filter 63R and connection between the low noise amplifier 22 and the reception filter 64R. The switch 53b is configured by, for example, an SPDT switch circuit in which a common terminal is connected to the matching circuit 42, one selection terminal is connected to the reception filter 63R, and the other selection terminal is connected to the reception filter 64R.

The switch 55b switches connection between the high pass filter 82 and the matching circuit 73 and connection between the high pass filter 82 and the matching circuit 74. The switch 55b is configured by, for example, an SPDT switch circuit in which a common terminal is connected to the high pass filter 82, one selection terminal is connected to the matching circuit 73, and the other selection terminal is connected to the matching circuit 74. In addition, the switch 55b can prevent the radio frequency signals in the high band group from being transmitted through the high band circuit 1H by connecting the common terminal to none of the selection terminals. That is, the switch 55b is an antenna switch that switches connection and disconnection between the high band circuit 1H and the antenna 2H.

In the high band circuit 1H, the number of communication bands to be transmitted is not limited to two and may be one or equal to or more than three. The necessity of the high pass filter 82, the number of duplexers, the number of matching circuits, and the necessities of the respective switches are determined in accordance with the number of communication bands.

The low band circuit 1L includes the power amplifier 13, the low noise amplifier 23, a low pass filter 83, duplexers 65 and 66, matching circuits 33, 43, 75 and 76, and switches 51c, 53c and 55c.

The power amplifier 13 is a transmission power amplifier that amplifies the transmission signals in the communication bands belonging to the low band group. The low noise amplifier 23 is a reception low noise amplifier that amplifies the reception signals in the communication bands belonging to the low band group with low noise.

The low pass filter 83 is connected between the antenna connection terminal 103 and the switch 55c, uses the frequency range of the low band group as a pass band, and transmits both the transmission signals and the reception signals in the low band group. With the arrangement of the low pass filter 83, it is possible to avoid leakage of harmonic waves of the transmission signals in the low band group to the middle band group and the high band group. Note that the low pass filter 83 may be a band pass filter whose pass band is the frequency range of the low band group.

The duplexer 65 transmits radio frequency signals in a communication band E of the low band group and includes a transmission filter 65T and a reception filter 65R. The transmission filter 65T is arranged on a transmission path connecting the power amplifier 13 and the antenna connection terminal 103 and transmits transmission signals in a transmission band of the communication band E among the transmission signals amplified by the power amplifier 13. The reception filter 65R is arranged on a reception path connecting the low noise amplifier 23 and the antenna connection terminal 103 and transmits reception signals in a reception band of the communication band E among the reception signals input from the antenna connection terminal 103.

The duplexer 66 transmits radio frequency signals in a communication band F of the low band group and includes a transmission filter 66T and a reception filter 66R. The transmission filter 66T is arranged on a transmission path connecting the power amplifier 13 and the antenna connection terminal 103 and transmits transmission signals in a transmission band of the communication band F among the transmission signals amplified by the power amplifier 13. The reception filter 66R is arranged on a reception path connecting the low noise amplifier 23 and the antenna connection terminal 103 and transmits reception signals in a reception band of the communication band F among the reception signals input from the antenna connection terminal 103.

The matching circuit 33 is arranged on a transmission path connecting the power amplifier 13 and the transmission filters 65T and 66T and performs impedance matching between the power amplifier 13 and the switch 51c and the transmission filters 65T and 66T. The matching circuit 43 is arranged on a reception path connecting the low noise amplifier 23 and the reception filters 65R and 66R and performs impedance matching between the low noise amplifier 23 and the switch 53c and the reception filters 65R and 66R. The matching circuit 75 is arranged on a path connecting the switch 55c and the duplexer 65 and performs impedance matching between the low pass filter 83 and the switch 55c and the duplexer 65. The matching circuit 76 is arranged on a path connecting the switch 55c and the duplexer 66 and performs impedance matching between the low pass filter 83 and the switch 55c and the duplexer 66.

The switch 51c is arranged on a transmission path connecting the matching circuit 33 and the transmission filters 65T and 66T and switches connection between the power amplifier 13 and the transmission filter 65T and connection between the power amplifier 13 and the transmission filter 66T. The switch 51c is configured by, for example, an SPDT switch circuit in which a common terminal is connected to the matching circuit 33, one selection terminal is connected to the transmission filter 65T, and the other selection terminal is connected to the transmission filter 66T.

The switch 53c is arranged on a reception path connecting the matching circuit 43 and the reception filters 65R and 66R and switches connection between the low noise amplifier 23 and the reception filter 65R and connection between the low noise amplifier 23 and the reception filter 66R. The switch 53c is configured by, for example, an SPDT switch circuit in which a common terminal is connected to the matching circuit 43, one selection terminal is connected to the reception filter 65R, and the other selection terminal is connected to the reception filter 66R.

The switch 55c switches connection between the low pass filter 83 and the matching circuit 75 and connection between the low pass filter 83 and the matching circuit 76. The switch 55c is configured by, for example, an SPDT switch circuit in which a common terminal is connected to the low pass filter 83, one selection terminal is connected to the matching circuit 75, and the other selection terminal is connected to the matching circuit 76. In addition, the switch 55c can prevent the radio frequency signals in the low band group from being transmitted through the low band circuit 1L by connecting the common terminal to none of the selection terminals. That is, the switch 55c is an antenna switch that switches connection and disconnection between the low band circuit 1L and the antenna 2L.

In the low band circuit 1L, the number of communication bands to be transmitted is not limited to two and may be one or equal to or more than three. The necessity of the low pass filter 83, the number of duplexers, the number of matching circuits, and the necessities of the respective switches are determined in accordance with the number of communication bands.

Further, the switches 55a, 55b, and 55c may be configured by one switch circuit 55. In this case, the switch circuit 55 is a multi-connection switch circuit capable of simultaneously connecting equal to or more than one of the middle band circuit 1M, the high band circuit 1H, and the low band circuit 1L to the antenna.

In addition, each of the band pass filter 81, the high pass filter 82, the low pass filter 83, the transmission filters 61T to 66T, and the reception filters 61R to 66R may be, for example, any one of a surface acoustic wave (SAW) filter, an elastic wave filter using a bulk acoustic wave (BAW), an LC resonance filter, and a dielectric filter, and is not limited thereto.

Further, one antenna may be connected to the radio frequency module 1. In this case, the above-described one antenna has antenna characteristics capable of radiating (transmitting) and receiving the radio frequency signals in the low band group, the middle band group, and the high band group. Moreover, in this case, the band pass filter 81, the high pass filter 82, and the low pass filter 83 configure a triplexer commonly connected to the above-described one antenna.

In addition, each of the power amplifiers 11 to 13 and the low noise amplifiers 21 to 23 is configured by, for example, a field effect transistor (FET) or a heterobipolar transistor (HBT) using Si-based complementary metal oxide semiconductor (CMOS) or GaAs as a material.

The low noise amplifiers 21 to 23 and the switch circuits 51, 53, and 55 may be formed in one semiconductor integrated circuit (IC). Furthermore, the above-described semiconductor IC may further include the power amplifiers 11 to 13. The semiconductor IC is formed of, for example, CMOS. Specifically, the semiconductor IC is formed by a silicon on insulator (SOI) process. Thus, the semiconductor IC can be manufactured at low cost. The semiconductor IC may be formed of at least any one of GaAs, SiGe, and GaN. This makes it possible to output radio frequency signals having high-quality amplification performance and noise performance.

With the above-described circuit configuration, the radio frequency module 1 according to the embodiment can execute at least one of transmission, reception, and transmission and reception of the radio frequency signals in any one communication band among the communication bands A to F by the communication band alone. In addition, the radio frequency module 1 can execute at least any one of simultaneous transmission, simultaneous reception, and simultaneous transmission and reception of the radio frequency signals in equal to or more than two communication bands among the communication bands A to F.

In the above-described circuit configuration, the radio frequency module 1 includes three circuits of the low band circuit 1L, the middle band circuit 1M, and the high band circuit 1H. However, it is sufficient that the radio frequency module 1 according to the embodiment includes at least two of the low band circuit 1L, the middle band circuit 1M, and the high band circuit 1H.

In addition, each of the duplexers 61 to 66 may have a configuration corresponding to a so-called time division duplex system including a filter for both transmission and reception and a transmission/reception switch. Even in this case, transmission and reception of different communication bands in the same band group can be simultaneously executed. For example, it is supposed that the transmission signal in the communication band A and the reception signal in the communication band B in the middle band group are simultaneously transmitted.

Here, when the circuit elements configuring the radio frequency module 1 are configured by one module as a small-sized front-end circuit, there is a problem that the power amplifiers and the low noise amplifiers of the same band groups interfere with each other and isolation between transmission and reception is deteriorated.

On the other hand, the radio frequency module 1 according to the embodiment has a configuration suppressing interference between the power amplifiers and the low noise amplifiers of the same band groups. Hereinafter, the configuration suppressing the above-described interference in the radio frequency module 1 according to the embodiment will be described.

[2. Circuit Element Arrangement Configuration of Radio Frequency Module 1A in Example]

Figure 2A:
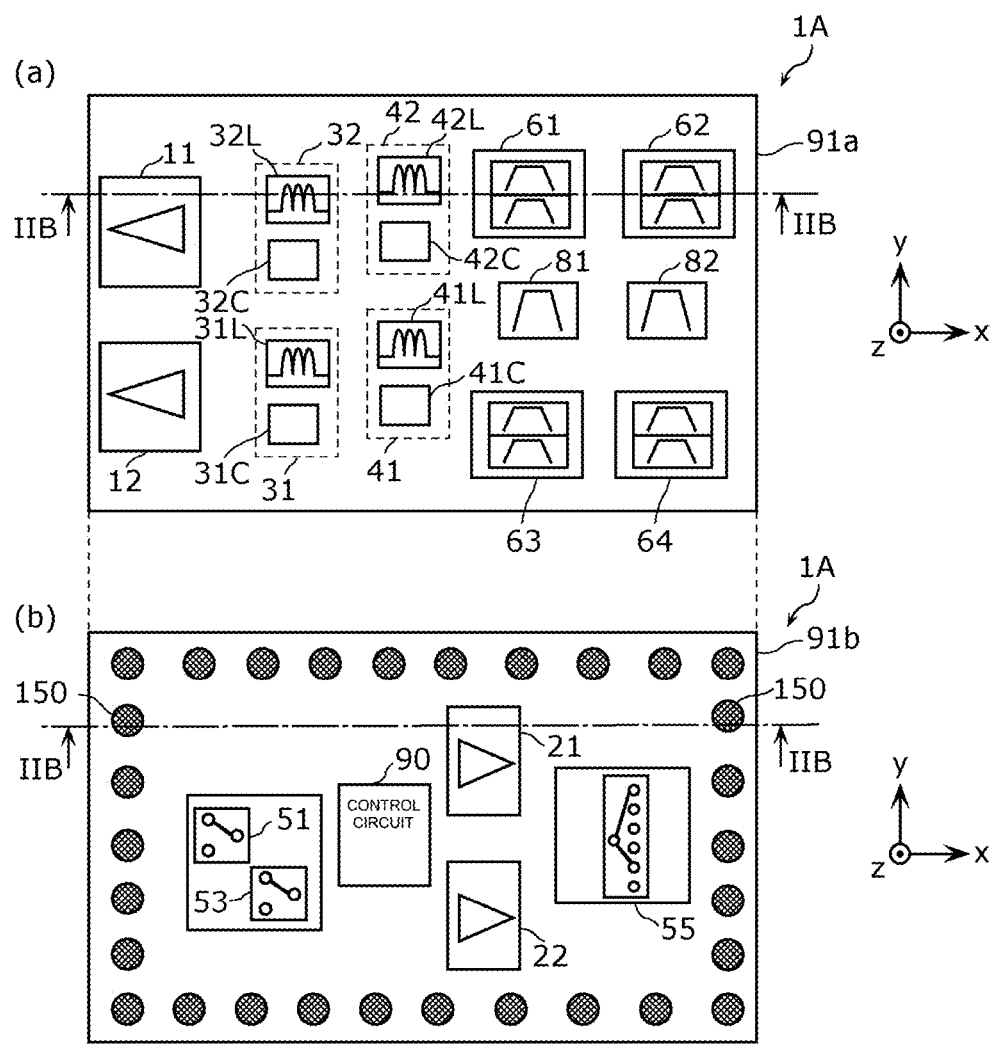
FIG. 2A is a schematic plan configuration diagram of a radio frequency module according to an example.
Figure 2B:
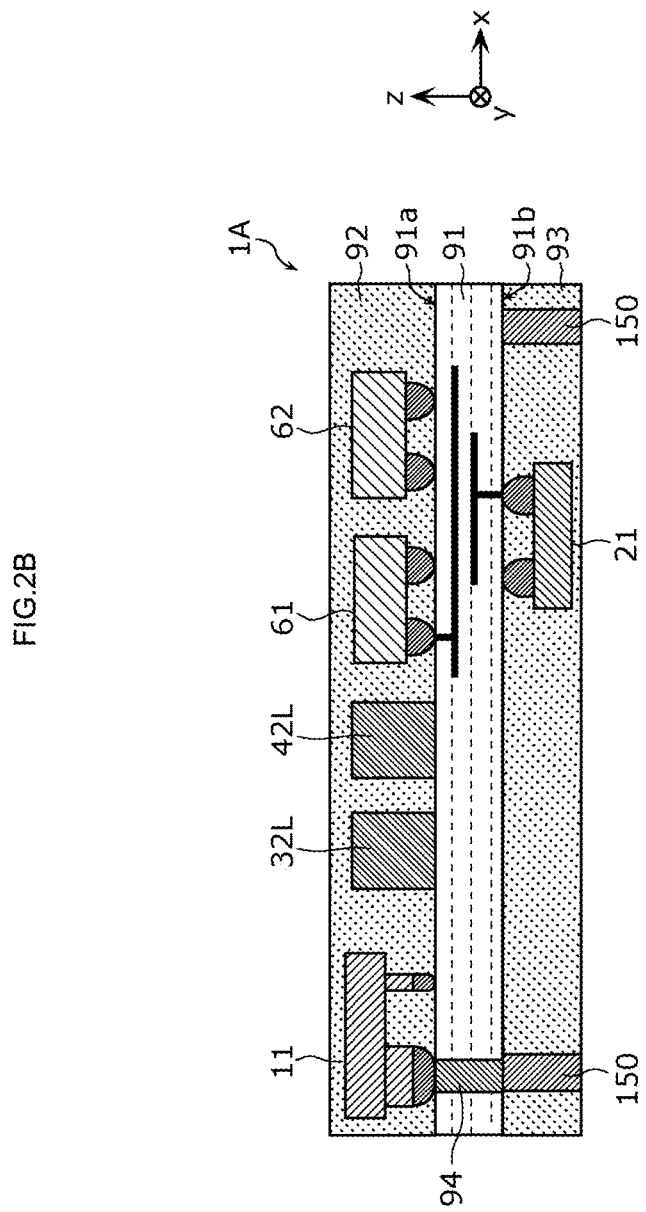
FIG. 2B is a schematic sectional configuration diagram of the radio frequency module in the example.

FIG. 2A is a schematic plan configuration diagram of a radio frequency module 1A according to an example. FIG. 2B is a schematic sectional configuration diagram of the radio frequency module 1A in the example, and specifically, is a sectional view along line IIB-IIB in FIG. 2A. (a) in FIG. 2A illustrates an arrangement diagram of circuit elements when a main surface 91a of main surfaces 91a and 91b of a module substrate 91, which face each other, is viewed from the positive z-axis direction side. On the other hand, (b) in FIG. 2A illustrates a perspective view of arrangement of the circuit elements when the main surface 91b is viewed from the z-axis positive direction side.

In the radio frequency module 1A in the example, the arrangement configuration of the circuit elements configuring the radio frequency module 1 in the embodiment is specifically indicated.

As illustrated in FIGS. 2A and 2B, the radio frequency module 1A in the example is a module on which the middle band circuit 1M and the high band circuit 1H in the circuit configuration illustrated in FIG. 1 are mounted. In addition to the circuit configuration illustrated in FIG. 1, the radio frequency module 1A further includes the module substrate 91 and resin members 92 and 93.

The module substrate 91 has the main surface 91a (first main surface) and the main surface 91b (second main surface) facing each other and is a mounting substrate on which the middle band circuit 1M and the high band circuit 1H are mounted. As the module substrate 91, for example, a low temperature co-fired ceramics (LTCC) substrate having a laminated structure of a plurality of dielectric layers, a printed substrate, or the like is used.

The resin member 92 is arranged on the main surface 91a of the module substrate 91, covers a part of the middle band circuit 1M, a part of the high band circuit 1H, and the main surface 91a of the module substrate 91, and has a function of securing reliability such as mechanical strength and moisture resistance of the circuit elements configuring the middle band circuit 1M and the high band circuit 1H.

The resin member 93 is arranged on the main surface 91b of the module substrate 91, covers a part of the middle band circuit 1M, a part of the high band circuit 1H, and the main surface 91b of the module substrate 91, and has a function of securing reliability such as mechanical strength and moisture resistance of the circuit elements configuring the middle band circuit 1M and the high band circuit 1H.

As illustrated in FIG. 2A and FIG. 2B, in the radio frequency module 1A in the example, the power amplifiers 11 and 12, the band pass filter 81 and the high pass filter 82, the duplexers 61 to 64, and the matching circuits 31, 32, 41, and 42 are surface-mounted on the main surface 91a of the module substrate 91. On the other hand, the low noise amplifiers 21 and 22, the switch circuits 51, 53, and 55, and the control circuit 90 are surface-mounted on the main surface 91b of the module substrate 91. The matching circuits 71 to 74 may be surface-mounted on any one of the main surfaces 91a and 91b of the module substrate 91 or may be incorporated in the module substrate 91.

The power amplifier 11 is an example of a first transmission power amplifier that amplifies transmission signals in the middle band group and is mounted on the main surface 91a of the module substrate 91. The low noise amplifier 21 is an example of a first low noise amplifier that amplifies reception signals in the middle band group and is mounted on the main surface 91b of the module substrate 91. That is, the power amplifier 11 and the low noise amplifier 21 are amplifier circuits that amplify radio frequency signals in the same band group.

The matching circuits 31 and 41 are conductive components that are mounted on the main surface 91a of the module substrate 91 and transmit the radio frequency signals in the middle band group. The matching circuit 31 includes an inductor 31L and a capacitor 31C, and the matching circuit 41 includes an inductor 41L and a capacitor 41C.

The matching circuits 32 and 42 are conductive components that are mounted on the main surface 91a of the module substrate 91 and transmit radio frequency signals in the high band group. The matching circuit 32 includes an inductor 32L and a capacitor 32C, and the matching circuit 42 includes an inductor 42L and a capacitor 42C.

Each of the inductors 31L, 32L, 41L, and 42L is, for example, a chip inductor. It should be noted that the matching circuit 31 is not required to include the capacitor 31C, the matching circuit 32 is not required to include the capacitor 32C, the matching circuit 41 is not required to include the capacitor 41C, and the matching circuit 42 is not required to include the capacitor 42C.

In the present disclosure, the conductive component is an electronic component having a conductive member such as a signal extraction electrode and is, for example, at least any one of a chip resistor, a chip capacitor, a chip inductor, a filter, a switch, and an active element such as an amplifier and a control circuit.

As illustrated in FIGS. 2A and 2B, the matching circuits 32 and 42 are mounted on the main surface 91a so as to be located between the power amplifier 11 and the low noise amplifier 21 when the module substrate 91 is viewed in plan.

With the above-described arrangement configuration of the power amplifier 11, the low noise amplifier 21, and the matching circuits 32 and 42, the power amplifier 11 and the low noise amplifier 21 of the middle band group (first band group) as the same band group are separately mounted on the main surfaces facing each other with the module substrate 91 interposed therebetween. Therefore, the radio frequency module 1A can be reduced in size as compared with a case where the power amplifier 11 and the low noise amplifier 21 having large mounting areas are mounted and arranged on the same mounting surface. In addition, signal interference between the power amplifier 11 and the low noise amplifier 21 is suppressed by interposing the module substrate 91 therebetween. Further, the matching circuits 32 and 42 of the high band group (second band group) different from the middle band group corresponding to the power amplifier 11 and the low noise amplifier 21 are arranged between the power amplifier 11 and the low noise amplifier 21. Therefore, in the above-described plan view, a distance between the power amplifier 11 and the low noise amplifier 21 can be largely ensured for the sizes of the matching circuits 32 and 42, and the conductive components corresponding to frequencies (high band) in another band group, which are not close to frequencies (middle band) corresponding to the power amplifier 11 and the low noise amplifier 21, are interposed, so that the conductive components can be used as shield members between the power amplifier 11 and the low noise amplifier 21. The signal interference between the power amplifier 11 and the low noise amplifier 21 of the middle band group can thereby be suppressed.

Further, the frequencies of harmonic waves generated from the power amplifier 11 of the middle band group are located on the higher frequency side than those of the high band group. For this reason, even when the conductive components of the high band group are arranged between the power amplifier 11 and the low noise amplifier 21 of the middle band group, the above-described harmonic components are prevented from flowing into the high band circuit 1H while passing through the conductive components of the high band group.

The matching circuits 32 and 42 may be mounted on the main surface 91b so as to be located between the power amplifier 11 and the low noise amplifier 21 in the above-described plan view.

Further, the conductive component that is mounted between the power amplifier 11 and the low noise amplifier 21 in the above-described plan view may be only one of the matching circuits 32 and 42.

The conductive component that is mounted between the power amplifier 11 and the low noise amplifier 21 in the above-described plan view may be at least one of the high pass filter 82, the duplexers 63 and 64, the matching circuits 73 and 74, and the switches 51b, 53b, and 55b that transmit the radio frequency signals in the high band group instead of the matching circuits 32 and 42. That is, the conductive component that is mounted between the power amplifier 11 and the low noise amplifier 21 in the above-described plan view may be a conductive component that transmits radio frequency signals in another band group different from the middle band group. Among these components, the high pass filter 82, the duplexers 63 and 64, and the matching circuits 73 and 74 are components that are difficult to be reduced in height. Therefore, they are desirably mounted on the main surface 91a on which the power amplifier 11 that is also difficult to be reduced in height is mounted. With this arrangement manner, the heights of the components that are mounted on the main surface 91a can be made uniform, and the heights of the components that are mounted on the main surface 91b can be made uniform. As a result, the radio frequency module 1A can be reduced in height.

Further, it is desirable that the radio frequency signals in the communication bands A and B configuring the middle band group and the radio frequency signals in the communication band passing through the transmission path in which the conductive component is arranged are not simultaneously transmitted. For example, when the conductive component is any one of the matching circuit 73, the transmission filter 63T, and the reception filter 63R, it is desirable that the radio frequency signals in the communication bands A and B configuring the middle band group and the radio frequency signals in the communication band C passing through the transmission path in which the above-described conductive component is arranged are not simultaneously transmitted. Thus, even if the radio frequency signals in the middle band group flow into the transmission circuit of the communication band C while passing through the above-described conductive component when no radio frequency signal in the communication band C is transmitted, the reception sensitivity of the communication band C can be prevented from being lowered because the radio frequency signals in the middle band group do not affect the transmission of the radio frequency signals in the communication band C.

Further, as illustrated in FIGS. 2A and 2B, the matching circuits 31 and 41 are mounted on the main surface 91a so as to be located between the power amplifier 12 and the low noise amplifier 22 when the module substrate 91 is viewed in plan.

With the above-described arrangement configuration of the power amplifier 12, the low noise amplifier 22, and the matching circuits 31 and 41, the power amplifier 12 and the low noise amplifier 22 of the high band group (first band group) as the same band group are separately mounted on the main surfaces facing each other with the module substrate 91 interposed therebetween. Therefore, the radio frequency module 1A can be reduced in size as compared with a case where the power amplifier 12 and the low noise amplifier 22 having large mounting areas are mounted and arranged on the same mounting surface. In addition, signal interference between the power amplifier 12 and the low noise amplifier 22 is suppressed by interposing the module substrate 91 therebetween. Further, the matching circuits 31 and 41 of the middle band group (second band group) different from the high band group corresponding to the power amplifier 12 and the low noise amplifier 22 are arranged between the power amplifier 12 and the low noise amplifier 22. Therefore, in the above-described plan view, a distance between the power amplifier 12 and the low noise amplifier 22 can be largely ensured for the sizes of the matching circuits 31 and 41, and the conductive components corresponding to frequencies (middle band) of another band group, which are not close to frequencies (high band) corresponding to the power amplifier 12 and the low noise amplifier 22, are interposed, so that the conductive components can be used as shield members between the power amplifier 12 and the low noise amplifier 22. The signal interference between the power amplifier 12 and the low noise amplifier 22 of the high band group can thereby be suppressed.

The matching circuits 31 and 41 may be mounted on the main surface 91b so as to be located between the power amplifier 12 and the low noise amplifier 22 in the above-described plan view.

Further, the conductive component that is mounted between the power amplifier 12 and the low noise amplifier 22 in the above-described plan view may be only one of the matching circuits 31 and 41.

The conductive component that is mounted between the power amplifier 12 and the low noise amplifier 22 in the above-described plan view may be at least one of the band pass filter 81, the duplexers 61 and 62, the matching circuits 71 and 72, and the switches 51a, 53a, and 55a that transmit the radio frequency signals in the middle band group instead of the matching circuits 31 and 41. That is, the conductive component that is mounted between the power amplifier 12 and the low noise amplifier 22 in the above-described plan view may be a conductive component that transmits radio frequency signals in another band group different from the high band group. Among these components, the band pass filter 81, the duplexers 61 and 62, and the matching circuits 71 and 72 are components that are difficult to be reduced in height. Therefore, they are desirably mounted on the main surface 91a on which the power amplifier 12 that is also difficult to be reduced in height is mounted. With this arrangement manner, the heights of the components that are mounted on the main surface 91a can be made uniform, and the heights of the components that are mounted on the main surface 91b can be made uniform. As a result, the radio frequency module 1A can be reduced in height.

In the radio frequency module 1A in the example, a plurality of external connection terminals 150 is arranged on the main surface 91b side of the module substrate 91. The radio frequency module 1A transfers electrical signals to/from an external substrate arranged on the negative z-axis direction side of the radio frequency module 1A while passing through the plurality of external connection terminals 150. Some of the plurality of external connection terminals 150 are set to a ground potential of the external substrate. The power amplifiers 11 and 12 that are difficult to be reduced in height are not arranged on the main surface 91b of the main surfaces 91a and 91b, which faces the external substrate, and the low noise amplifiers 21 and 22, the switch circuits 51, 53 and 55, and the control circuit 90 that are easily reduced in height are arranged thereon. The entire radio frequency module 1A can thereby be reduced in height. In addition, the plurality of external connection terminals 150 applied as ground electrodes is arranged around the low noise amplifiers 21 and 22 that affect the reception sensitivity of the reception circuit. Deterioration in the reception sensitivity of the reception circuit can thereby be suppressed.

In the radio frequency module 1A in the example, a ground pattern is arranged in the module substrate 91 or on the surface of the module substrate 91. With this configuration, since the ground pattern is interposed between the power amplifier 11 and the low noise amplifier 21, isolation between the transmission signals and the reception signals in the middle band group can be further improved. In addition, since the ground pattern is interposed between the power amplifier 12 and the low noise amplifier 22, isolation between the transmission signals and the reception signals in the high band group can be further improved. That is, since the power amplifiers and the low noise amplifiers in the same band groups are arranged on the opposite surfaces of the module substrate 91 having the ground pattern, it is possible to further improve the isolation between transmission and reception of the radio frequency signals in the same band groups.

The external connection terminals 150 may be columnar electrodes penetrating through the resin member 93 in the z-axis direction or may be bump electrodes arranged on electrodes formed on the main surface 91b. When the external connection terminals 150 are the bump electrodes, the resin member 93 is not required to be provided.

As illustrated in (b) of FIG. 2A, at least two of the low noise amplifiers 21 and 22, the switch circuits 51, 53, and 55, and the control circuit 90 may be incorporated in the same semiconductor IC. By arranging, on the main surface 91b, the semiconductor IC in which these components and circuits capable of being reduced in height are incorporated, it is possible to reduce the thickness by polishing the main surface 91b side in a manufacturing process. Accordingly, the radio frequency module 1A can be reduced in height.

Here, the circuit configuration of the power amplifier 11 will be described.

Figure 2C:
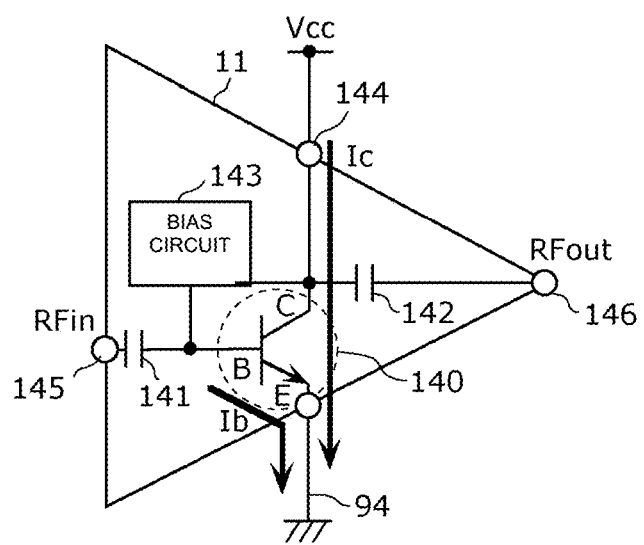
FIG. 2C is a circuit configuration diagram of a power amplifier in the example.

FIG. 2C is a circuit configuration diagram of the power amplifier 11 included in the radio frequency module 1A in the example. As illustrated in the drawing, the power amplifier 11 includes a transistor 140, capacitors 141 and 142, a bias circuit 143, a collector terminal 144, an emitter terminal, an input terminal 145, and an output terminal 146.

The transistor 140 is, for example, an emitter-grounded bipolar transistor having a collector, an emitter, and a base. The transistor 140 amplifies a radio frequency current input to the base and outputs the amplified current from the collector. Note that the transistor 140 may be a field effect transistor having a drain, a source, and a gate.

The capacitor 141 is a capacitive element for DC cutting and has a function of preventing a DC current from leaking to the input terminal 145 due to a DC bias voltage applied from the bias circuit 143 to the base.

The capacitor 142 is a capacitive element for DC cutting and has a function of removing a DC component of the radio frequency amplified signal on which the DC bias voltage has been superimposed. The radio frequency amplified signal from which the DC component has been removed is output from the output terminal 146.

The bias circuit 143 is connected to the base of the transistor 140 and has a function of optimizing an operating point of the transistor 140 by applying the bias voltage to the base.

With the above-described circuit configuration of the power amplifier 11, a radio frequency signal RFin input from the input terminal 145 becomes a base current Ib flowing from the base to the emitter of the transistor 140. The base current Ib is amplified by the transistor 140 to become a collector current Ic, and a radio frequency signal RFout corresponding to the collector current Ic is output from the output terminal 146. At this time, a large current which is the sum of the base current Ib and the collector current Ic flows from the emitter terminal to the ground.

The base terminal, the collector terminal, and the emitter terminal (ground terminal) are arranged on the main surface 91a and are formed of metallic electrode layers, metallic bump members, or the like.

As illustrated in FIG. 2B, a through electrode 94 is connected to the ground terminal of the power amplifier 11 and penetrates through between the main surface 91a and the main surface 91b. The through electrode 94 is connected to the external connection terminal 150 on the main surface 91b.

The above-described circuit configuration of the power amplifier 11 can eliminate a heat dissipation path passing through only a planar wiring pattern along an xy plane direction having a large thermal resistance in the wiring in the module substrate 91. Therefore, the small-sized radio frequency module 1A with an improved heat dissipation property from the power amplifier 11 to the external substrate can be provided.

Here, the through electrode 94 is not limited to be formed by one cylindrical via conductor reaching the main surface 91b from the main surface 91a in the module substrate 91. The through electrode 94 may have a structure in which a plurality of cylindrical via conductors is connected in series. Via-receiving electrodes along respective layers are formed between the plurality of cylindrical via conductors connected in series, and the cylindrical via conductors adjacent to each other in the z-axis direction at least partially overlap with each other when the main surface 91b is viewed in plan from the main surface 91b. That is, the through electrode 94 has no path in the xy plane direction passing through only the planar wiring pattern and has a path in the z-axis direction.

Further, as illustrated in FIG. 2B, it is desirable that no wiring is arranged in a region overlapping with the inductor 32L connected to the output terminal of the power amplifier 12 in the above-described plan view. It is also desirable that no wiring is arranged in a region overlapping with the inductor 31L connected to the output terminal of the power amplifier 11 in the above-described plan view.

Moreover, it is desirable that no radio frequency component is arranged in the region overlapping with the inductor 32L connected to the output terminal of the power amplifier 12 in the above-described plan view. In addition, it is desirable that no radio frequency component is arranged in the region overlapping with the inductor 31L connected to the output terminal of the power amplifier 11 in the above-described plan view.

This makes it possible to suppress magnetic field coupling of the circuit elements in the radio frequency module 1A with the inductors through which high-power transmission signals amplified by the power amplifier 11 or 12 flow. Therefore, deterioration in the isolation between transmission and reception can be suppressed, and deterioration in the reception sensitivity can be suppressed.

Alternatively, the power amplifier 11 may be mounted on the main surface 91b of the module substrate 91 whereas the low noise amplifier 21 may be mounted on the main surface 91a of the module substrate 91.

[3. Circuit Element Arrangement Configuration of Radio Frequency Module 1B According to Variation]

Figure 3A:
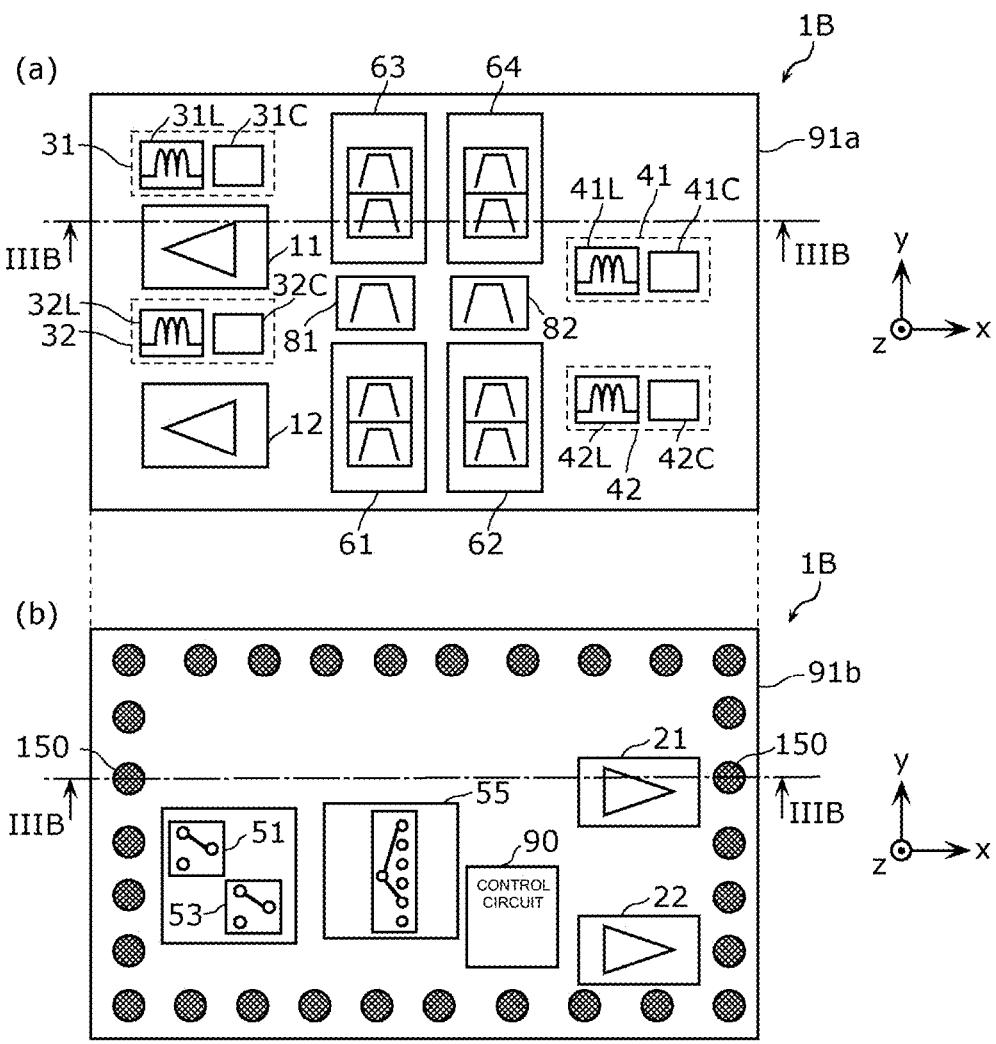
FIG. 3A is a schematic plan configuration diagram of a radio frequency module according to a variation.
Figure 3B:
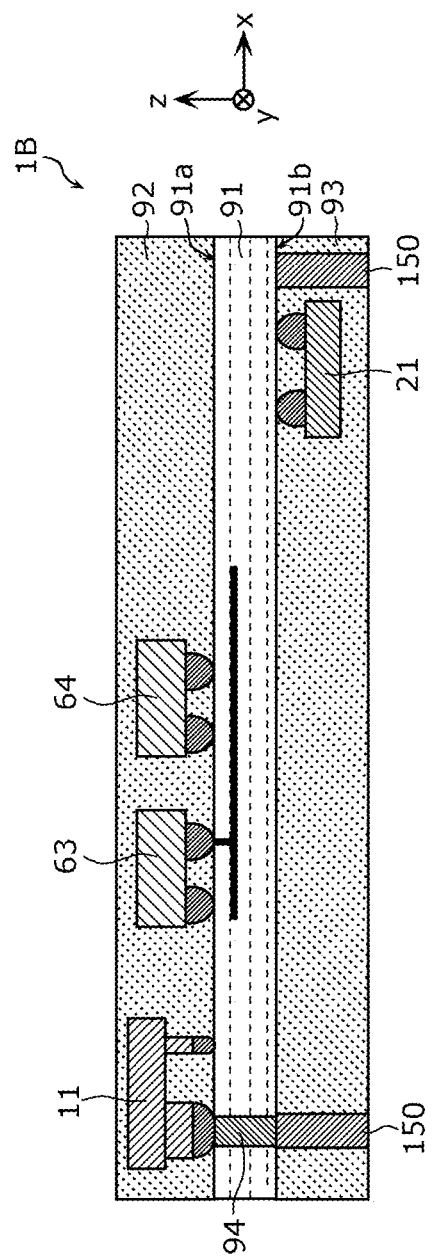
FIG. 3B is a schematic sectional configuration diagram of the radio frequency module in the variation.

FIG. 3A is a schematic plan configuration diagram of a radio frequency module 1B according to a variation. FIG. 3B is a schematic sectional configuration diagram of the radio frequency module 1B in the variation, and specifically, is a sectional view along line IIIB-IIIB in FIG. 3A. (a) in FIG. 3A illustrates an arrangement diagram of circuit elements when the main surface 91a of the main surfaces 91a and 91b of the module substrate 91, which face each other, is viewed from the positive z-axis direction side. On the other hand, (b) in FIG. 3A illustrates a perspective view of arrangement of the circuit elements when the main surface 91b is viewed from the z-axis positive direction side.

In the radio frequency module 1B in the variation, the arrangement configuration of the circuit elements configuring the radio frequency module 1 in the embodiment is specifically indicated. The radio frequency module 1B in the variation is different from the radio frequency module 1A in the example only in the arrangement configuration of the circuit elements configuring the radio frequency module 1B. Hereinafter, as for the radio frequency module 1B in the variation, description of the same points as those of the radio frequency module 1A in the example will be omitted and different points will be described.

As illustrated in FIGS. 3A and 3B, the radio frequency module 1B in the variation is a module on which the middle band circuit 1M and the high band circuit 1H in the circuit configuration illustrated in FIG. 1 are mounted. In addition to the circuit configuration illustrated in FIG. 1, the radio frequency module 1B further includes the module substrate 91 and the resin members 92 and 93.

As illustrated in FIGS. 3A and 3B, in the radio frequency module 1B in the variation, the power amplifiers 11 and 12, the band pass filter 81 and the high pass filter 82, the duplexers 61 to 64, and the matching circuits 31, 32, 41, and 42 are surface-mounted on the main surface 91a of the module substrate 91. On the other hand, the low noise amplifiers 21 and 22, the switch circuits 51, 53, and 55, and the control circuit 90 are surface-mounted on the main surface 91b of the module substrate 91. The matching circuits 71 to 74 may be surface-mounted on any one of the main surfaces 91a and 91b of the module substrate 91 or may be incorporated in the module substrate 91.

The power amplifier 11 is an example of a first transmission power amplifier that amplifies transmission signals in the middle band group and is mounted on the main surface 91a of the module substrate 91. The low noise amplifier 21 is an example of a first low noise amplifier that amplifies reception signals in the middle band group and is mounted on the main surface 91b of the module substrate 91.

The power amplifier 12 is an example of a first transmission power amplifier that amplifies transmission signals in the high band group and is mounted on the main surface 91a of the module substrate 91. The low noise amplifier 22 is an example of a first low noise amplifier that amplifies reception signals in the high band group and is mounted on the main surface 91b of the module substrate 91.

The duplexers 61 and 62 are conductive components that are mounted on the main surface 91a of the module substrate 91 and transmit radio frequency signals in the middle band group. The duplexer 61 includes the transmission filter 61T and the reception filter 61R. The duplexer 62 includes the transmission filter 62T and the reception filter 62R.

The duplexers 63 and 64 are conductive components that are mounted on the main surface 91a of the module substrate 91 and transmit radio frequency signals in the high band group. The duplexer 63 includes the transmission filter 63T and the reception filter 63R. The duplexer 64 includes the transmission filter 64T and the reception filter 64R.

Here, as illustrated in FIGS. 3A and 3B, the duplexers 63 and 64 are mounted on the main surface 91a so as to be located between the power amplifier 11 and the low noise amplifier 21 when the module substrate 91 is viewed in plan.

With the above-described arrangement configuration of the power amplifier 11, the low noise amplifier 21, and the duplexers 63 and 64, the power amplifier 11 and the low noise amplifier 21 of the middle band group (first band group) as the same band group are separately mounted on the main surfaces facing each other with the module substrate 91 interposed therebetween. Therefore, the radio frequency module 1B can be reduced in size as compared with a case where the power amplifier 11 and the low noise amplifier 21 having large mounting areas are mounted and arranged on the same mounting surface. In addition, signal interference between the power amplifier 11 and the low noise amplifier 21 is suppressed by interposing the module substrate 91 therebetween. Further, the duplexers 63 and 64 of the high band group (second band group) different from the middle band group corresponding to the power amplifier 11 and the low noise amplifier 21 are arranged between the power amplifier 11 and the low noise amplifier 21. Therefore, in the above-described plan view, a distance between the power amplifier 11 and the low noise amplifier 21 can be largely ensured for the sizes of the duplexers 63 and 64, and the conductive components corresponding to frequencies (high band) in another band group, which are not close to frequencies (middle band) corresponding to the power amplifier 11 and the low noise amplifier 21, are interposed, so that the conductive components can be used as shield members between the power amplifier 11 and the low noise amplifier 21. The signal interference between the power amplifier 11 and the low noise amplifier 21 of the middle band group can thereby be suppressed.

Further, the frequencies of harmonic waves generated from the power amplifier 11 of the middle band group are located on the higher frequency side than those of the high band group. For this reason, even when the conductive components of the high band group are arranged between the power amplifier 11 and the low noise amplifier 21 of the middle band group, the above-described harmonic components are prevented from flowing into the high band circuit 1H while passing through the conductive components of the high band group.

The duplexers 63 and 64 may be mounted on the main surface 91b so as to be located between the power amplifier 11 and the low noise amplifier 21 in the above-described plan view.

In addition, the conductive component that is mounted between the power amplifier 11 and the low noise amplifier 21 in the above-described plan view may be only one of the duplexers 63 and 64 or may be any one of the transmission filters 63T and 64T and the reception filters 63R and 64R.

Further, as illustrated in FIGS. 3A and 3B, the duplexers 61 and 62 are mounted on the main surface 91a so as to be located between the power amplifier 12 and the low noise amplifier 22 when the module substrate 91 is viewed in plan.

With the above-described arrangement configuration of the power amplifier 12, the low noise amplifier 22, and the duplexers 61 and 62, the power amplifier 12 and the low noise amplifier 22 of the high band group (first band group) as the same band group are separately mounted on the main surfaces facing each other with the module substrate 91 interposed therebetween. Therefore, the radio frequency module 1B can be reduced in size as compared with a case where the power amplifier 12 and the low noise amplifier 22 having large mounting areas are mounted and arranged on the same mounting surface. In addition, signal interference between the power amplifier 12 and the low noise amplifier 22 is suppressed by interposing the module substrate 91 therebetween. Further, the duplexers 61 and 62 of the middle band group (second band group) different from the high band group corresponding to the power amplifier 12 and the low noise amplifier 22 are arranged between the power amplifier 12 and the low noise amplifier 22. Therefore, in the above-described plan view, a distance between the power amplifier 12 and the low noise amplifier 22 can be largely ensured for the sizes of the duplexers 61 and 62, and the conductive components corresponding to frequencies (middle band) in another band group, which are not close to frequencies (high band) corresponding to the power amplifier 12 and the low noise amplifier 22, are interposed, so that the conductive components can be used as shield members between the power amplifier 12 and the low noise amplifier 22. The signal interference between the power amplifier 12 and the low noise amplifier 22 of the high band group can thereby be suppressed.

The duplexers 61 and 62 may be mounted on the main surface 91b so as to be located between the power amplifier 12 and the low noise amplifier 22 in the above-described plan view.

Further, the conductive component that is mounted between the power amplifier 12 and the low noise amplifier 22 in the above-described plan view may be only one of the duplexers 61 and 62 or may be any one of the transmission filters 61T and 62T and the reception filters 61R and 62R.

[4. Effects]

As described above, the radio frequency module 1 in the embodiment includes the module substrate 91 having the main surfaces 91a and 91b facing each other, the first transmission power amplifier that amplifies the transmission signal in the first band group, the first low noise amplifier that amplifies the reception signal in the first band group, and the conductive component arranged on the transmission path for transmitting the radio frequency signal in the second band group whose frequencies do not overlap with those of the first band group, wherein the first transmission power amplifier is mounted on the main surface 91a, the first low noise amplifier is mounted on the main surface 91b, and the conductive component is mounted between the first transmission power amplifier and the first low noise amplifier on the main surface 91a or 91b when the module substrate 91 is viewed in plan.

With the above-described configuration, the radio frequency module 1 can be reduced in size as compared with a case where the first transmission power amplifier and the first reception low noise amplifier having large mounting areas are mounted and arranged on the same mounting surface. In addition, the signal interference between the first transmission power amplifier and the first reception low noise amplifier is suppressed by interposing the module substrate 91 therebetween. Further, the conductive component of the second band group different from the first band group is arranged between the first transmission power amplifier and the first reception low noise amplifier. The distance between the first transmission power amplifier and the first reception low noise amplifier can be largely ensured for the size of the conductive component, and the conductive component of the second band group different from the first band group is interposed therebetween, so that the conductive component can be used as the shield material between the first transmission power amplifier and the first reception low noise amplifier. The signal interference between the first transmission power amplifier and the first reception low noise amplifier of the first band group can thereby be suppressed.

Further, the external connection terminals 150 connected to the external substrate may be arranged on the main surface 91b.

Thus, it is possible to suppress the deterioration in the reception sensitivity of the reception circuit including the first reception low noise amplifier mounted on the main surface 91b.

Further, the through electrode 94 connected to the ground terminal of the first transmission power amplifier and penetrating through between the main surface 91a and the main surface 91b of the module substrate 91 may be provided, and the through electrode 94 may be connected to the external connection terminal 150 on the main surface 91b.

This configuration can eliminate a heat dissipation path passing through only a planar wiring pattern along the main surface direction having a large thermal resistance in the wiring in the module substrate 91. Therefore, the small-sized radio frequency module 1 with an improved heat dissipation property from the first transmission power amplifier to the external substrate can be provided.

In addition, the conductive component may be an antenna switch that switches conduction and non-conduction between the transmission path for transmitting the radio frequency signal in the second band group and the antenna connection terminal, and the conductive component may be mounted on the main surface 91b.

With this configuration, the antenna switch that can be easily reduced in height is mounted on the main surface 91b together with the first reception low noise amplifier that can be easily reduced in height, thereby reducing the radio frequency module 1 in height. Further, since the antenna switch and the first reception low noise amplifier are mounted on the same main surface 91b, they can be incorporated in the same semiconductor IC and the miniaturization of the radio frequency module 1 is accelerated.

Moreover, the second reception low noise amplifier that is mounted on the main surface 91b and amplifies the reception signal in the second band group may be provided, and the conductive component and the second reception low noise amplifier may be incorporated in the same semiconductor IC.

This configuration further accelerates the miniaturization of the radio frequency module 1.

The conductive component may be a filter, a duplexer, a chip capacitor, or a chip inductor arranged on the transmission path for transmitting the radio frequency signal in the second band group, and the conductive component may be mounted on the main surface 91a.

With this configuration, since each of the filter, the duplexer, the chip capacitor, and the chip inductor is a component that is difficult to be reduced in height, it is desirable to mount it on the main surface 91a on which the first transmission power amplifier that is also difficult to be reduced in height is mounted. With this arrangement manner, the heights of the components that are mounted on the main surface 91a can be made uniform, and the heights of the components that are mounted on the main surface 91b can be made uniform. As a result, the radio frequency module 1 can be reduced in height.

In addition, it is desirable that the inductor connected to the output terminal of the first transmission power amplifier is further included and no wiring is arranged in the region overlapping with the inductor in the above-described plan view.

Further, it is desirable that no radio frequency component is arranged in the region overlapping the inductor in the above-described plan view.

This configuration makes it possible to suppress magnetic field coupling of the circuit elements in the radio frequency module 1 with the inductor through which the high-power transmission signal amplified by the first transmission power amplifier flows. Therefore, deterioration in the isolation between transmission and reception can be suppressed, and deterioration in the reception sensitivity can be suppressed.

In addition, it is desirable that the radio frequency signal in the communication band configuring the first band group and the radio frequency signal in the communication band passing through the transmission path in which the conductive component is arranged are not simultaneously transmitted.

Thus, even if the radio frequency signal in the first band group flows into the transmission circuit of the communication band belonging to the second band group while passing through the conductive component when no radio frequency signal in the communication band is transmitted, the reception sensitivity of the communication band can be prevented from being lowered because the radio frequency signal in the first band group does not affect the transmission of the radio frequency signal in the communication band.

Further, the first band group may be one of the low band group, the middle band group, and the high band group whose frequencies do not overlap with each other, and the second band group may be another band group different from the one band group among the low band group, the middle band group, and the high band group.

The first band group may be one of the middle band group and the high band group, and the second band group may be the other of the middle band group and the high band group.

The frequencies of harmonic waves generated from the transmission power amplifier of the middle band group are located on the higher frequency side than those of the high band group. For this reason, even when the conductive component of the high band group is arranged between the transmission power amplifier and the reception low noise amplifier of the middle band group, the above-described harmonic components are prevented from flowing into the high band circuit while passing through the conductive component of the high band group.

Further, the communication apparatus 5 in the embodiment includes the RFIC 3 configured to process the radio frequency signal that is transmitted and received by the antenna and the radio frequency module 1 configured to transmit the radio frequency signal between the antenna and the RFIC 3.

Accordingly, the small-sized communication apparatus 5 with improved isolation between transmission and reception can be provided.

Other Embodiments

Although the radio frequency module and the communication apparatus according to the embodiment of the disclosure have been described with reference to the example and the variation, the radio frequency module and the communication apparatus according to the disclosure are not limited to the example and the modification. Other embodiments that are realized by combining desired constituent elements in the above-described example and variation, variations that are obtained by applying various variations conceived by those skilled in the art to the above-described example and variation without departing from the gist of the disclosure and various apparatuses incorporating the radio frequency module and the communication apparatus as described above are also encompassed in the disclosure.

For example, in the radio frequency module and the communication apparatus in the example and the variation described above, another circuit element, wiring, or the like may be inserted in the path connecting the circuit elements and signal paths disclosed in the drawings.

Further, the transmission power amplifier that amplifies the transmission signal in a predetermined band group means that when frequency-gain characteristics of the transmission power amplifier are measured, a frequency range with a gain of equal to or more than a predetermined value includes a frequency range of one communication band belonging to the above-described predetermined band group. The above-described predetermined value may be, for example, a gain that is reduced by 3 dB from a maximum gain of the transmission power amplifier.

Further, the reception low noise amplifier that amplifies the reception signal in a predetermined band group means that when frequency-gain characteristics of the reception low noise amplifier are measured, a frequency range with a gain of equal to or more than a predetermined value includes a frequency range of one communication band belonging to the above-described predetermined band group. The above-described predetermined value may be, for example, a gain that is reduced by 3 dB from a maximum gain of the reception low noise amplifier.

Further, the transmission path for transmitting the radio frequency signal in a predetermined band group means that a pass band of a filter arranged on the transmission path includes a frequency range of one communication band belonging to the above-described predetermined band group. Alternatively, the transmission path for transmitting the radio frequency signal in a predetermined band group means that when frequency-gain characteristics of an amplifier arranged in the transmission path are measured, a frequency range with a gain of equal to or more than a predetermined value includes a frequency range of one communication band belonging to the above-described predetermined band group. Alternatively, the transmission path for transmitting the radio frequency signal in a predetermined band group means that a transmission signal output from the RFIC to the above-described transmission path is included in a frequency range of one communication band belonging to the above-described predetermined band group. The above-described predetermined value may be, for example, a gain that is reduced by 3 dB from a maximum gain of the amplifier.

INDUSTRIAL APPLICABILITY

The disclosure can be widely used in communication apparatuses such as cellular phones as a radio frequency module arranged in a multiband front-end unit.

REFERENCE SIGNS LIST 1, 1A, 1B RADIO FREQUENCY MODULE
1H HIGH BAND CIRCUIT
1L LOW BAND CIRCUIT
1M MIDDLE BAND CIRCUIT
2H, 2L, 2M ANTENNA
3 RF SIGNAL PROCESSING CIRCUIT (RFIC)
4 BASEBAND SIGNAL PROCESSING CIRCUIT (BBIC)
5 COMMUNICATION APPARATUS
11, 12, 13 POWER AMPLIFIER
21, 22, 23 LOW NOISE AMPLIFIER
31, 32, 33, 41, 42, 43, 71, 72, 73, 74, 75, 76 MATCHING CIRCUIT
31C, 32C, 41C, 42C CAPACITOR
31L, 32L, 41L, 42L INDUCTOR
51, 53, 55 SWITCH CIRCUIT
51a, 51b, 51c, 53a, 53b, 53c, 55a, 55b, 55c SWITCH
61, 62, 63, 64, 65, 66 DUPLEXER
61R, 62R, 63R, 64R, 65R, 66R RECEPTION FILTER
61T, 62T, 63T, 64T, 65T, 66T TRANSMISSION FILTER
81 BAND PASS FILTER
82 HIGH PASS FILTER
83 LOW PASS FILTER
90 CONTROL CIRCUIT
91 MODULE SUBSTRATE
91a, 91b MAIN SURFACE
92, 93 RESIN MEMBER
94 THROUGH ELECTRODE
101, 102, 103 ANTENNA CONNECTION TERMINAL
111, 112, 113 TRANSMISSION INPUT TERMINAL
121, 122, 123 RECEPTION OUTPUT TERMINAL
140 TRANSISTOR
141, 142 CAPACITOR
143 BIAS CIRCUIT
144 COLLECTOR TERMINAL
145 INPUT TERMINAL
146 OUTPUT TERMINAL
150 EXTERNAL CONNECTION TERMINAL

The invention claimed is:
1. A radio frequency module, comprising:
a mounting substrate having a first main surface and a second main surface that face each other;

a first transmission power amplifier mounted on the first main surface, the first transmission power amplifier amplifying a transmission signal in a first band group;

a first reception low noise amplifier mounted on the second main surface, the first reception low noise amplifier amplifying a reception signal in the first band group; and a conductor arranged on a transmission path for transmitting a radio frequency signal in a second band group, the second band group having frequencies which do not overlap with frequencies of the first band group, wherein the conductor is mounted on the first main surface or the second main surface, and in a plan view, the conductor is between the first transmission power amplifier and the first reception low noise amplifier.

2. The radio frequency module according to claim 1, wherein an external connection terminal, connected to an external substrate, is arranged on the second main surface.

3. The radio frequency module according to claim 2, further comprising:

a through electrode connected to a ground terminal of the first transmission power amplifier, the through electrode passing between the first main surface and the second main surface of the mounting substrate, wherein the through electrode is connected to the external connection terminal on the second main surface.

4. The ratio frequency module according to claim 2, wherein the conductor is an antenna switch that switches conduction and non-conduction between the transmission path and an antenna connection terminal, and the conductor is mounted on the second main surface.

5. The ratio frequency module according to claim 4, further comprising:

a second reception low noise amplifier that is mounted on the second main surface, the second reception low noise amplifier amplifies a reception signal in the second band group, wherein the conductor and the second reception low noise amplifier are incorporated in a same semiconductor integrated circuit (IC).

6. The radio frequency module according to claim 2, wherein the conductor is a filter, a duplexer, a chip capacitor, or a chip inductor arranged in the transmission path, and the conductor is mounted on the first main surface.

7. The radio frequency module according to claim 6, wherein in the plan view, no radio frequency component is arranged in the region overlapping with the inductor.

8. The radio frequency module according to claim 2, further comprising:

an inductor connected to an output terminal of the first transmission power amplifier, wherein in the plan view, no wiring is arranged in a region overlapping with the inductor.

9. The radio frequency module according to claim 2, wherein a first radio frequency signal in a communication band configuring the first band group and a second radio frequency signal in a communication band passing through the transmission path are not simultaneously transmitted.

10. The radio frequency module according to claim 2, wherein the first band group is one of a low band group, a middle band group, and a high band group whose frequencies do not overlap each other, and the second band group is another band group different from the one band group among the low band group, the middle band group, and the high band group.

11. The radio frequency module according to claim 1, wherein the conductor is an antenna switch that switches conduction and non-conduction between the transmission path and an antenna connection terminal, and the conductor is mounted on the second main surface.

12. The radio frequency module according to claim 11, further comprising:

a second reception low noise amplifier that is mounted on the second main surface, the second reception low noise amplifier amplifies a reception signal in the second band group, wherein the conductor and the second reception low noise amplifier are incorporated in a same semiconductor integrated circuit (IC).

13. The radio frequency module according to claim 1, wherein the conductor is a filter, a duplexer, a chip capacitor, or a chip inductor arranged in the transmission path, and the conductor is mounted on the first main surface.

14. The radio frequency module according to claim 1, further comprising:

an inductor connected to an output terminal of the first transmission power amplifier, wherein in the plan view, no wiring is arranged in a region overlapping with the inductor.

15. The radio frequency module according to claim 14, wherein in the plan view, no radio frequency component is arranged in the region overlapping with the inductor.

16. The ratio frequency module according to claim 1, wherein a first radio frequency signal in a communication band configuring the first band group and a second radio frequency signal in a communication band passing through the transmission path are not simultaneously transmitted.

17. The ratio frequency module according to claim 1, wherein the first band group is one of a low band group, a middle band group, and a high band group whose frequencies do not overlap each other, and the second band group is another band group different from the one band group among the low band group, the middle band group, and the high band group.

18. The ratio frequency module according to claim 17, wherein the first band group is one of the middle band group and the high band group, and the second band group is the other of the middle band group and the high band group.

19. A communication apparatus, comprising:

an RF signal processing circuit configured to process a radio frequency signal that is transmitted and received by an antenna; and the ratio frequency module according to claim 1, wherein the radio frequency module is configured to transmit the radio frequency signal between the antenna and the RF signal processing circuit.

* * * * *